(12) United States Patent
Chen

(10) Patent No.: US 6,509,257 B1
(45) Date of Patent: Jan. 21, 2003

(54) SEMICONDUCTOR DEVICE AND PROCESS FOR MAKING THE SAME

(75) Inventor: Shih-Chang Chen, Hsin-Chu (TW)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/633,103

(22) Filed: Aug. 4, 2000

(30) Foreign Application Priority Data

Oct. 19, 1999 (JP) .......................................... 11-297128

(51) Int. Cl.[7] ....................... H01L 21/4763; H01L 24/44
(52) U.S. Cl. ..................... 438/622; 438/627; 438/628; 438/637; 438/687
(58) Field of Search ................................ 438/618, 622, 438/624, 625, 638, 637, 645, 647, 687, 685, 627, 628; 257/642, 773, 774, 775, 760

(56) References Cited

U.S. PATENT DOCUMENTS

| | | | |
|---|---|---|---|
| 6,140,220 A | * 10/2000 | Lin | 438/618 |
| 6,177,347 B1 | * 1/2001 | Liu et al. | 438/675 |
| 6,274,923 B1 | * 8/2001 | Mikagi | 257/642 |
| 2001/0001742 A1 | * 5/2001 | Huang et al. | 438/710 |

\* cited by examiner

*Primary Examiner*—Wael Fahmy
*Assistant Examiner*—Brook Kebede
(74) *Attorney, Agent, or Firm*—Kanesaka & Takeuchi

(57) ABSTRACT

A process for making a semiconductor device, comprises a first step of embedding a conductive material in a via-hole formed in a first interlayer dielectric film to form a conductive plug connected to a lower layer wiring line, a second step of forming an upper layer wiring groove in a second interlayer dielectric film formed on the conductive plug such that a target area of the conductive plug is exposed in the upper layer wiring groove, a third step of forming a first barrier layer on an entire surface of the second interlayer dielectric film including the upper layer wiring groove, and a fourth step of embedding a wiring material in the upper layer wiring groove to form an upper layer wiring line. The process further comprises a fifth step of selectively removing the first barrier layer formed only on the conductive plug prior to the fourth step.

14 Claims, 14 Drawing Sheets

SEMICONDUCTOR DEVICE AND PROCESS FOR MAKING THE SAME

BACKGROUND OF THE INVENTION

1. Field of the Invention

The present invention relates to semiconductor devices and processes for making the same, and more particularly, to a semiconductor device employing copper for an upper layer wiring and a process of making the same. This application is a counterpart application of Japanese application Serial Number 11-297128 filed Oct. 19, 1999, the subject matter of which is incorporated herein by reference.

2. Description of the Related Art

In order to meet demands for high degrees of integration and density in semiconductor integrated circuits, submicron technology is applied to electrode wiring. Since the semiconductor integrated circuits require high speeds and low energy consumption, copper wiring is widely used in the submicron electrode wiring for its low resistance and high reliability.

One of the most popular methods of forming the copper wiring is a damascene process by which copper is deposited on an interlayer dielectric film so as to fill wiring grooves formed in the interlayer dielectric film, and polished and removed by chemical mechanical polishing (CMP) except for those in the wiring grooves. The copper is deposited usually by plating process which is superior to sputtering process in the burying characteristics and economy.

In order to simplify the damascene process for economy, a dual damascene process wherein wiring and conductive plugs are formed simultaneously draws attention. In the dual damascene method, wiring and conductive plugs are formed simultaneously with the same material by forming wiring grooves and via-holes or through-holes in an interlayer dielectric film, depositing copper on the film so as to fill the via- or through-holes, polishing away the copper film by the CMP process except for those in the wiring groove and via- or through-holes, thereby reducing the process time and cost.

However, the current sputtering process employed by the dual damascene process is so poor in burying characteristics that it is difficult to bury conductive material evenly in wiring grooves or via- or through-holes where the aspect ratio of the via- or through-holes between wiring lines is increased by submicron technology. Since it is comparatively easy to bury conductive material in the single damascene process, the use of the single damascene process to the manufacture by submicron technology of wiring lines for high-density, high-integration semiconductor devices is expected to increase.

In order to prevent copper from diffusing into the interlayer dielectric film upon deposition in the upper layer wiring grooves, a barrier layer of titanium nitride (TiN) or tantalum nitride (TaN) is formed by sputter process or the like on the upper layer wiring grooves prior to the copper deposition. Since the barrier layer is formed on the conductive plugs in the wiring grooves as well as the interlayer dielectric film surface, upper layer copper wires are formed via the barrier layer.

The film formation by CVD process for copper wiring has the problems of separation, impurity contamination, and high cost so that it is impractical to apply to the device manufacture. The film formed by sputtering process has comparatively poor covering property over the groundwork so that it is impossible to form films conformably. Thus, copper wiring is formed usually by plating process which has excellent burying characteristics. In this case, a copper seed layer must be formed by sputtering process, for example, to conduct electric current upon plating.

The process for forming tungsten (W) conductive plugs and upper-layer copper wires by the single damascene process for a double layer wiring structure will be described with reference to FIGS. 13 and 14. Alternatively, the W plugs may be replaced by copper plugs formed by plating process (hereinafter "plated Cu plugs"). FIGS. 13(a)–(c) and 14(a)–(b) show the manufacturing process of a semiconductor device.

In FIG. 13(a), a dielectric film 1 and a stopper protective film (not shown) of silicon nitride (SiN) or the like are formed on a semiconductor substrate (not shown) on which predetermined elements are formed. Then, a lower layer wiring groove is formed by anisotropic etching such as reactive ion etching (RIE). Then, a metal, such as copper, is deposited on the entire surface so as to fill the lower layer wiring groove, forming a metal film, which is then polished by CMP, for example, until the stopper protective film is exposed, forming a lower layer wiring line 2. Then, an interlayer dielectric film 3 and a stopper protective film 4 of SiN or the like are deposited successively on the dielectric film including the lower layer wiring line 2.

Then, resist is applied to the stopper protective film 4 to form a resist film (not shown). Then, the stopper protective film 4 and the interlayer dielectric film 3 within a target area are removed by photolithography and etching to a predetermined line thickness to form a predetermined via- or through-hole.

Then, an adhesion layer 5 for CVD-W deposition is formed on the entire surface including the via- or through-hole, and a blanket CVD-W layer is deposited so as to fill the via- or through-hole. Then, the excessive CVD-W layer and the adhesion layer 5 on the stopper protective layer 4 are removed by CMP to form a W plug 6.

In FIG. 13(b), a first interlayer dielectric film 7 is deposited on the entire surface including the CVD-W layer, resist is then applied to form a resist film (not shown), and then photolithography and etching are applied to form an upper layer wiring groove 8.

In FIG. 13(c), a barrier layer, such as a TiN or TaN film, is deposited on the entire surface including the upper layer wiring groove 8 to prevent copper from diffusing into the interlayer dielectric film 3 from a copper line to be formed in the wiring groove 8. Then, a seed layer is deposited to form a barrier/seed layer 9 as an electrode for depositing a plated-Cu film.

In FIG. 14(a), a copper wiring film 10 is deposited by plating process on the entire surface so as to fill the upper layer wiring groove 8 in the barrier/seed layer 9 (hereinafter "plated Cu film"). Then, as shown in FIG. 14(b), the plated Cu film 10 is polished by CMP process until the barrier/seed layer 9 and the interlayer dielectric film 7 are exposed so that the plated Cu film is left only in the upper layer wiring groove 8, forming an upper layer copper wire 11.

As shown in FIG. 14(b), in the single damascene process there is the barrier/seed layer 9 between the upper layer Cu wire 11 and the W plug 6 to prevent diffusion of the copper so that electrical conduction is made through the barrier/seed layer 9 between the upper layer Cu wire 11 and the W plug 6.

However, the resistivity of the barrier layer is 10 or more times higher than that of the Cu wire so that low resistance wiring material is used to reduce the wiring resistance. However, the parasite resistance of wiring is still very high. This considerably lowers the wiring characteristics and thus the device characteristics and, therefore, it is necessary to avoid the use of the high resistance film as a barrier layer between the wiring and the conductive plug for reducing the resistance of the entire wiring and keeping the device high performance. Especially, it is necessary in the highly integrated devices made by submicron technology using low resistance wiring materials.

SUMMARY OF THE INVENTION

The present invention is made to solve the above problems.

According to an aspect of the invention, there is provided a semiconductor device which comprises a ground layer having a surface at which surfaces of a dielectric film and a lower layer wiring line embeded in said dielectric film are exposed, a first interlayer dielectric film formed on the surface of the ground layer and having a via-hole formed therein such that the surface of the lower layer wiring line is exposed in the via-hole, a conductive plug formed in the via-hole and connected to the lower layer wiring line within the via-hole, a second interlayer dielectric film having an upper layer wiring groove formed on a surface of the conductive plug such that the surface of the conductive plug is exposed in the upper layer wiring groove, a first barrier layer formed on side walls of the upper layer wiring groove, and an upper layer wiring line formed in the upper layer wiring groove and directly connected to the conductive plug within the upper layer wiring groove.

According to the aspect, the barrier layer is formed only on the side walls of the upper layer wiring groove and not provided between the upper layer wiring line and the conductive plug. Consequently, the diffusion of copper from the upper layer wiring groove into the interlayer dielectric film is prevented and, since there is no high resistance barrier layer between the upper layer wire and the conductive plug, the resistance of wiring is reduced, resulting in the high speed, reliable device.

According to another aspect of the invention, there is provided a semiconductor device which further comprises a second barrier layer formed on side walls of the via-hole such that the conductive plug is directly connected to the lower layer wiring line. In this aspect, even when Cu plug is used as a conductive plug, the barrier layer is formed only on the side walls of the via-hole and not provided between the lower layer wiring line and the conductive plug. Consequently, the diffusion of copper from the via-hole into the interlayer dielectric film is prevented and, since there is no high resistance barrier layer between the via-hole and the conductive plug, the resistance of wiring is reduced, resulting in the high speed, reliable device.

According to still another aspect of the invention, there is provided a process for making a semiconductor device which comprise the steps of a first step of embedding a conductive material in a via-hole formed in a first interlayer dielectric film to form a conductive plug connected to a lower layer wiring line, a second step of forming an upper layer wiring groove in a second interlayer dielectric film formed on the conductive plug such that a target area of the conductive plug is exposed in the upper layer wiring groove, a third step of forming a first barrier layer on an entire surface of the second interlayer dielectric film including the upper layer wiring groove and a fourth step of embedding a wiring material in the upper layer wiring groove to form an upper layer wiring line. The process further comprises a fifth step of selectively removing the first barrier layer formed only on the conductive plug prior to the fourth step.

According to the aspect, even with a single damascene method, the barrier layer is formed only on the side walls of the upper layer wiring groove and the upper layer wire is formed without any barrier layer between the upper layer wiring groove and the conductive plug. Consequently, the diffusion of copper from the upper layer wiring into the interlayer dielectric film is prevented and, since there is no high resistance barrier layer between the upper layer wiring and the conductive plug, the resistance of wiring is reduced, resulting in the high speed, reliable device.

According to yet another aspect, there is provided a process which further comprises a sixth step of forming a second barrier layer on an entire surface of the first interlayer dielectric film including the via-hole prior to the first step and a seventh step of selectively removing the second barrier layer formed only on the lower layer wiring line prior to the first step but subsequent to the sixth step.

According to the aspect, the barrier layer is formed only on the side walls of the via-hole and the plate Cu plug is formed without any barrier layer between the lower layer wiring line and the plated Cu plug. Consequently, the diffusion of copper from the via-hole into the first interlayer dielectric film is prevented and, since there is no high resistance barrier layer between the lower layer wire and the plated Cu plug, the resistance of wiring is reduced, resulting in the high speed, reliable device.

According to another aspect of the invention, there is provided a process of making a semiconductor device which further comprise an eighth step of forming a stopper protective film on an entire surface of the second interlayer dielectric film including the conductive plug prior to the second step and a ninth step of selectively removing the stopper protective film outside a target area of the conductive plug prior to the second step but subsequent to the eighth step. The stopper protective film is formed as a CMP stopper and for preventing oxidation of the plated Cu-plug. The stopper protective film is made of silicon nitride (SiN) as an embodiment.

According to still another aspect of the invention, the stopper protective film is made of titanium nitride (TiN). Even if some of the TiN, which is lower in resistance than SiN, is left in the subsequent etching step to form a hole above the plug (or an upper layer wiring groove), the resistance between the wiring and the conductive plug is not increased. Also, the TiN film is lower in deposition temperature than the SiN film so that it is possible to reduce the fabrication temperature of semiconductor devices.

According to yet another aspect of the invention, the stopper protective film is made of tungsten nitride (WN). Even if some of the WN, which is lower in resistance than SiN and better in barrier property than TiN, is left in the subsequent etching step to form a hole above the plug (or an upper layer wiring groove), not only the resistance between the wiring and the conductive plug is not increased but also the prevention of the copper diffusion is improved. Also, the WN film is lower in deposition temperature than the SiN film so that it is possible to reduce the fabrication temperature of semiconductor devices.

According to another aspect of the invention, the stopper protective film is made of tantalum nitride (TiN). Since the TaN film, which is superior to the TiN and WN films with respect to thin film and barrier properties, is used as a stopper protective film, it is possible to provide thinner film barrier layers and higher barrier effects than before, which makes possible to not only avoid the influence of barrier layer thickness upon wiring characteristics in submicron technology but also maintain the low copper wiring resistance. In addition, since the TaN film has lower resistivity than silicate films, the reliability of the process and device is increased.

DESCRIPTION OF THE PREFERRED EMBODIMENTS

Figure 1A:
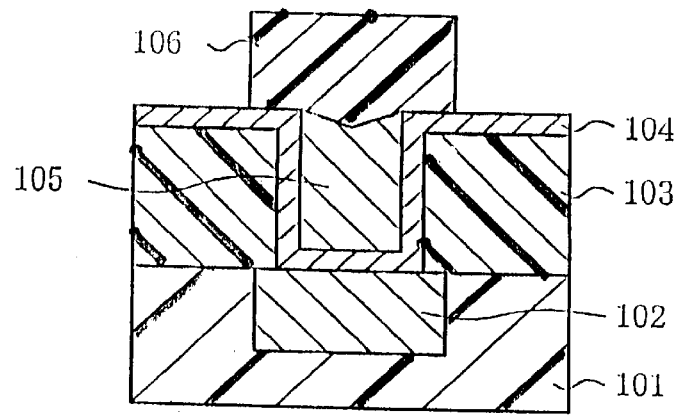
FIGS. 1(a) to (c) are sectional views of processes for making a semiconductor device according to the first embodiment of the invention.

Embodiments of the invention will now be described with reference to the accompanying drawings, wherein components having the same function and structure are assigned with the same reference character throughout the specification and drawings and overlapping description will be avoided.

As shown in FIGS. 1–12, a barrier layer is formed only on the side walls of an upper layer wiring groove or through-hole and no barrier layer is present between the wiring line and the conductive plug in the semiconductor device according to the embodiments of the invention.

That is, a barrier layer is formed in the upper layer wiring groove in which the conductive plug is exposed, and the barrier layer only on the conductive plug is removed, and an upper layer Cu wiring is formed. Also, a barrier layer is formed in the through-hole in which a lower layer wiring line is exposed, the barrier layer only on the lower layer wiring line is removed, and a Cu conductive plug is formed.

(1) First Embodiment

As shown in FIGS. 1 and 2, a barrier/seed layer is formed only on the side walls of an upper layer wiring groove to not only prevent diffusion of the copper into the interlayer dielectric film but also provide a low resistance wiring structure between the upper layer wiring and the conductive plug. In this embodiment, a W plug is formed in a via- or through-hole by reactive ion etching (RIE).

In FIG. 1(a), a first interlayer dielectric film 103 is deposited on the entire surface of a dielectric film 101 having a lower layer wiring line 102 formed on a semiconductor substrate (not shown) on which predetermined elements are formed. Then, resist is applied to form a resist film (not shown), the first interlayer dielectric film 103 within a target area is subjected to photolithography and etching processes to form a desired via- or through-hole (hereinafter simply "via-hole").

Then, an adhesion layer 104 for CVD-W deposition is formed on the entire surface including the via-hole, and a blanket CVD-W layer is then deposited so as to fill the via-hole. The CVD-W layer outside the target area is then removed by anisotropic RIE to leave the CVD-W layer only within the via-hole, forming a W plug 105, which makes an electrical connection between the lower layer wiring line 102 and an upper layer wiring line. Then, resist is applied to the target area on the W plug 105 to deposit a resist film 106 to etch off by anisotropic RIE the adhesion layer 104 outside the target area on the W plug 105.

Figure 1B:
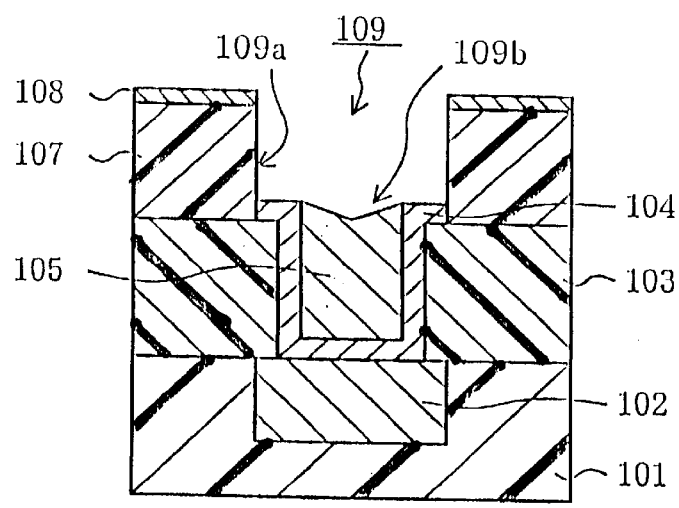

In FIG. 1(b), a second interlayer dielectric film 107 and a lower layer barrier film 108 of TiN or TaN are successively deposited, and resist is applied to the entire surface to form a resist film (not shown). Then, photolithography and etching processes are applied to remove the second interlayer film 107 and the lower barrier film 108 in the target area above the W plug 105, forming an upper layer wiring groove 109. In this embodiment, the upper layer wiring groove 109 is made wider than the via-hole; however, the side walls 109a of the upper layer wiring groove 109 may be positioned on the adhesion layer 104.

Figure 1C:
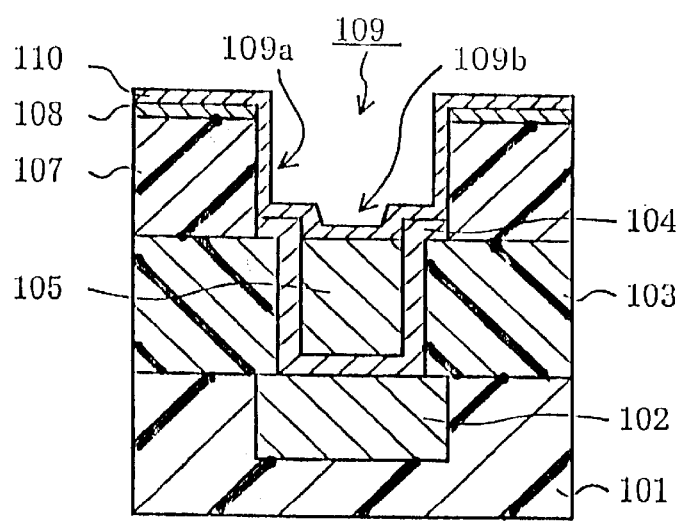

In FIG. 1(c), an upper layer barrier film 110 of TiN or TaN is deposited on the entire surface including the upper layer wiring groove 109 to prevent copper from diffusing from the upper layer wiring groove 109 into the second interlayer dielectric film 107.

Figure 2A:
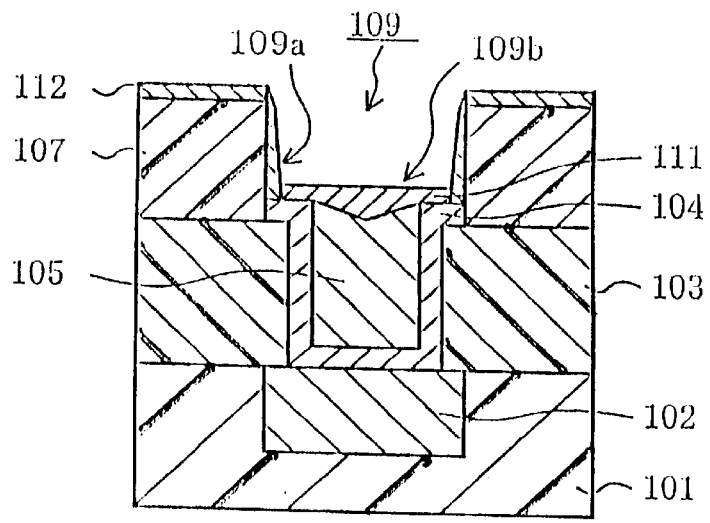
FIGS. 2(a) to (c) are sectional views of processes for making a semiconductor device according to the first embodiment of the invention, which are continued from FIG. 1.

In FIG. 2(a), the upper barrier film 110 only on the W plug 105 is etched back by RIE to leave the upper layer barrier film 110 only on the side walls 109a of the upper layer wiring groove 109 to prevent the copper diffusion. Then, a Cu seed layer 111 is deposited thereon as a copper plating electrode. Consequently, a barrier/seed layer 112 is formed on the side walls 109a of the upper layer wiring groove as a groundwork for upper layer Cu wiring deposition, and the seed layer 111 is formed on the W plug 105 or bottom 109b of the upper layer wiring groove 109.

Figure 2B:
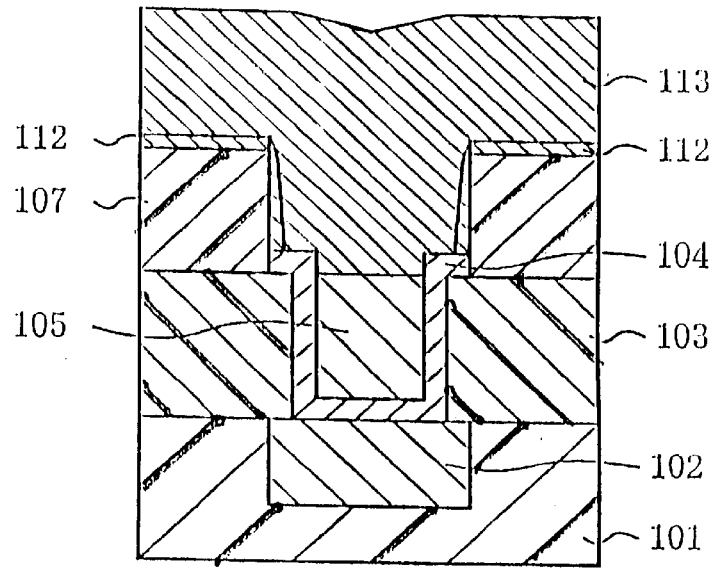

In FIG. 2(b), a plated Cu film 113 is deposited by plating process on the entire surface so as to fill the upper layer wiring groove 109, on which the barrier/seed layer 112 and the seed layer 111 are formed, so that the seed layer 111 is integrated with the plated Cu film 113.

Figure 2C:
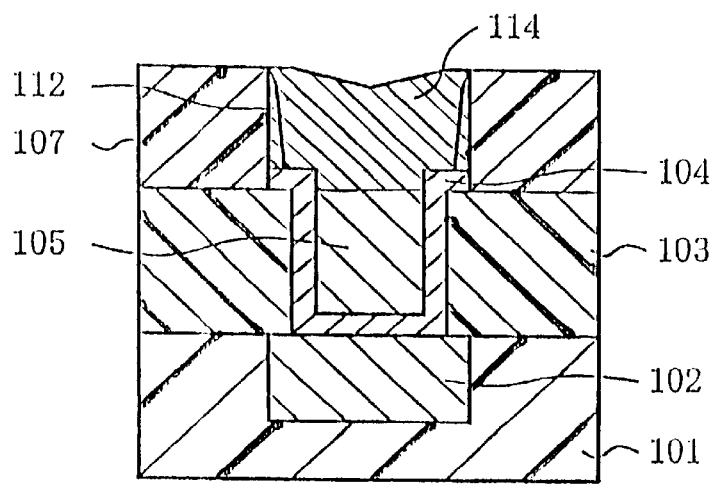

In FIG. 2(c), the plated Cu film 113 is polished by CMP process until the second interlayer dielectric film 107 is exposed, leaving the plated Cu film 113 only in the upper layer wiring groove 109 to form an upper layer Cu wire 114.

As has been described above, it is possible to not only form by the single damascene process a barrier layer only on the side walls of an upper layer wiring groove but also form an upper layer Cu wire without any barrier layer between the upper layer Cu wire and the W plug. Consequently, the diffusion of copper from the upper layer wiring into the second interlayer dielectric film is prevented and, since there is no high resistance barrier layer between the upper layer Cu wire and the W plug, the resistance of wiring is reduced, resulting in the high speed, reliable device.

(2) Second Embodiment

As shown in FIGS. 3 and 4, according to this embodiment, there is provided a low resistance wiring structure which prevents the presence of a high resistance barrier layer between the upper layer wiring and the conductive plug as well as the diffusion of copper into the interlayer dielectric film by the formation of a barrier/seed layer only the side walls of an upper layer wiring groove. In this embodiment, the W plug within a via-hole is formed by metal CMP instead of etching back.

Figure 3A:
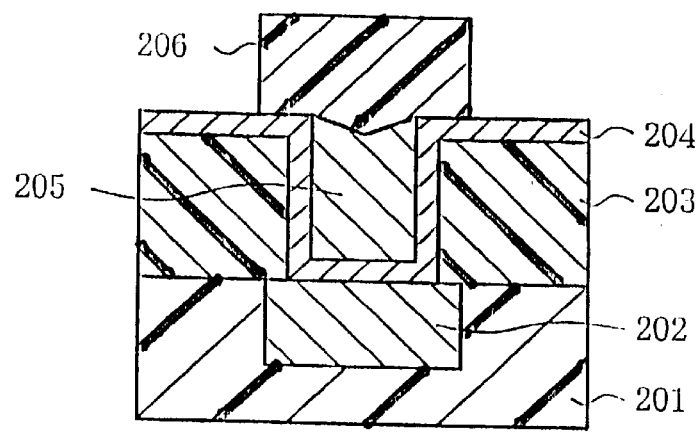
FIGS. 3(a) to (c) are sectional views of processes for making a semiconductor device according to the second embodiment of the invention.

In FIG. 3(a), a first interlayer dielectric film 203 is deposited on the entire surface of a dielectric film 201 having a lower layer wiring line 202 formed on a semiconductor substrate (not shown) on which predetermined elements are formed. Then, resist is applied to form a resist film (not shown), the first interlayer dielectric film 203 within a target area is subjected to photolithography and etching processes to form a desired via- or through-hole (hereinafter simply "via-hole").

Then, an adhesion layer 204 for CVD-W deposition is formed on the entire surface including the via-hole, and a blanket CVD-W layer is then deposited so as to fill the via-hole. The CVD-W layer outside the target area is then removed by metal CMP until the adhesion layer 204 is exposed to leave the CVD-W layer only within the via-hole, forming a W plug 205, which makes an electrical connection between the lower layer wiring line 202 and an upper layer wiring line. Then, resist is applied to the target area on the W plug 205 to deposit a resist film 206 to etch off by anisotropic RIE the adhesion layer 204 outside the target area above the W plug 205.

As has been described above, in this embodiment, the W-plug 205 within the via-hole is formed by metal CMP.

Figure 3B:
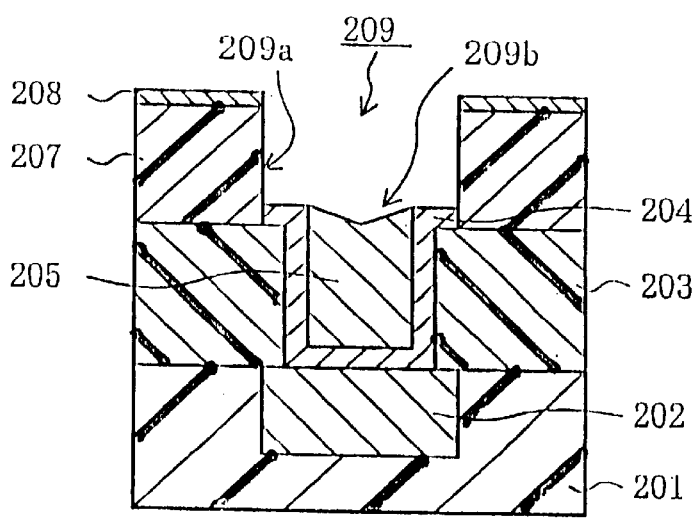

In FIG. 3(b), a second interlayer dielectric film 207 and a lower layer barrier film 208 of TiN or TaN are successively deposited, and resist is applied to the entire surface to form a resist film (not shown). Then, photolithography and etching processes are applied to remove the second interlayer film 207 and the lower barrier film 208 in the target area above the W plug 205, forming an upper layer wiring groove 209. In this embodiment, the upper layer wiring groove 209 is made wider than the via-hole; however, the side walls 209a of the upper layer wiring groove 209 may be positioned on the adhesion layer 204.

Figure 3C:
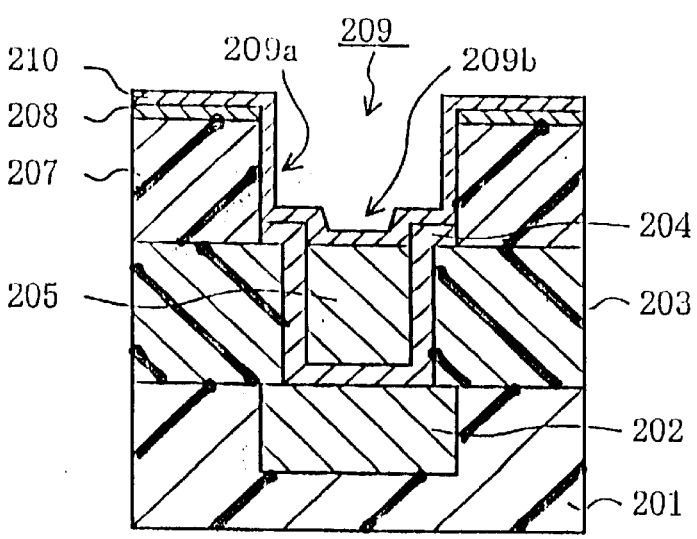

In FIG. 3(c), an upper barrier film 210 of TiN or TaN is deposited on the entire surface including the upper layer wiring groove 209 to prevent copper from diffusing from the upper layer wiring groove 209 into the second interlayer dielectric film 207.

Figure 4A:
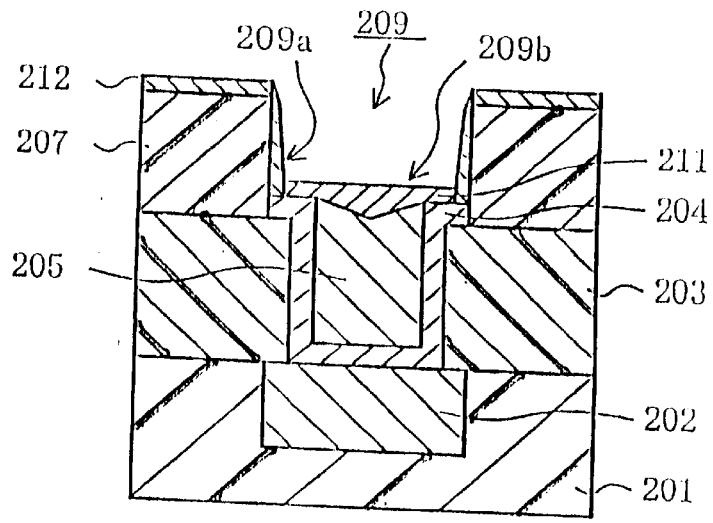
FIGS. 4(a) to (c) are sectional views of processes for making a semiconductor device according to the second embodiment of the invention, which are continued from FIG. 3.

In FIG. 4(a), the upper barrier film 210 only on the W plug 205 is etched back by RIE to leave the upper layer barrier film 210 only on the side walls 209a of the upper layer wiring groove 209 to prevent the copper diffusion. Then, a Cu seed layer 211 is deposited thereon as a copper plating electrode. Consequently, a barrier/seed layer 212 is formed on the side walls 209a of the upper layer wiring groove as a groundwork for upper layer Cu wiring deposition, and the seed layer 211 is formed on the W plug 205 or bottom 209b of the upper layer wiring groove 209.

Figure 4B:
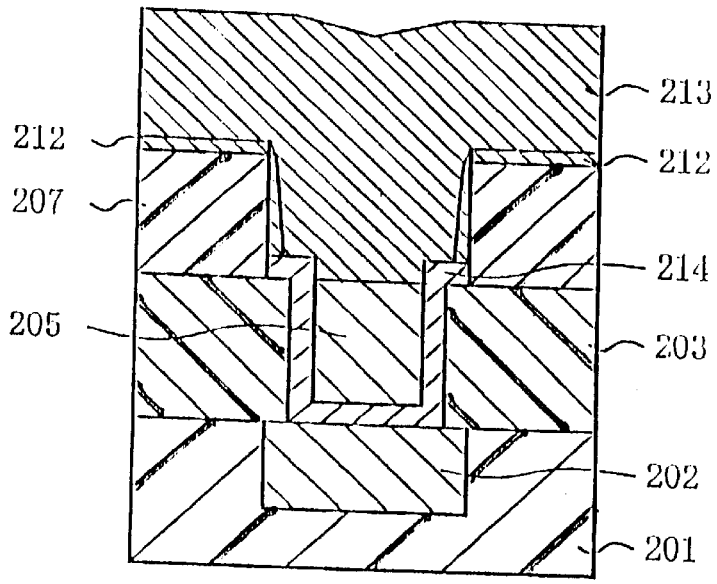

In FIG. 4(b), a plated Cu film 213 is deposited by plating process on the entire surface so as to fill the upper layer wiring groove 209, on which the barrier/seed layer 212 and the seed layer 211 are formed, so that the seed layer 211 is integrated with the plated Cu film 213.

Figure 4C:
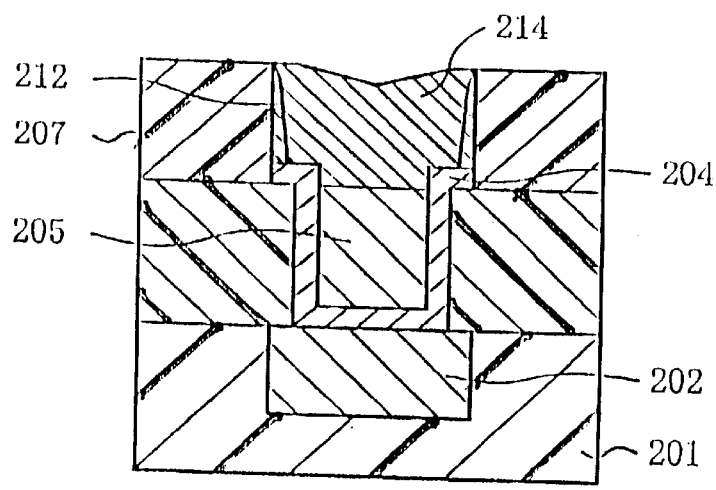

In FIG. 4(c), the plated Cu film 213 is polished by CMP process until the second interlayer dielectric film 207 is exposed to leave the plated Cu film 213 only in the upper layer wiring groove 209, forming an upper layer Cu wire 214.

As has been described above, it is possible to not only form by the single damascene process a barrier layer only on the side walls of an upper layer wiring groove but also form an upper layer Cu wire without any barrier layer between the upper layer Cu wire and the W plug. Consequently, the diffusion of copper from the upper layer wiring into the second interlayer dielectric film is prevented and, since there is no high resistance barrier layer between the upper layer Cu wire and the W plug, the resistance of wiring is reduced, resulting in the high speed, reliable device.

The third through sixth embodiments will now be described below which are able to provide a resistance of the entire wiring lower than those of the first and second embodiments and a margin of fabrication processes wider than those of the first and second embodiments. In these embodiments, a stopper protective film is formed on the plated Cu-plug as a CMP stopper and for preventing oxidation of the plated Cu-plug. Also, in order to form a plated Cu-plug as a conductive plug, a barrier layer is formed only on the side walls of a via-hole to prevent diffusion of copper into the interlayer dielectric film from the via-hole.

(3) Third Embodiment

In this embodiment as shown in FIGS. 5 and 6, a Cu wiring is formed by electrical plating (EP) and a SiN film is used as a stopper protective film.

Figure 5A:
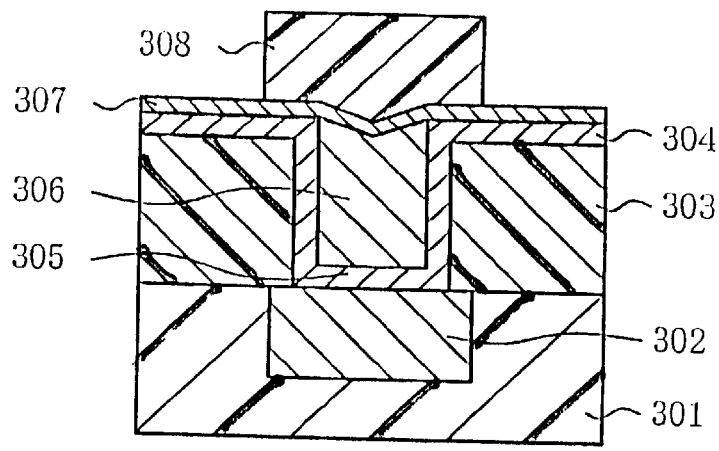
FIGS. 5(a) to (c) are sectional views of processes for making a semiconductor device according to the third embodiment of the invention.

In FIG. 5(a), a first interlayer dielectric film 303 is deposited on the entire surface of a dielectric film 301 having a lower layer wiring line 302 formed on a semiconductor substrate (not shown) on which predetermined elements are formed. Then, resist is applied to form a resist film (not shown), and the first interlayer dielectric film 303 within a target area is subjected to photolithography and etching processes to form a desired via- or through-hole (hereinafter simply "via-hole").

Then, a barrier layer for preventing copper diffusion is deposited on the entire surface including the via-hole, and the barrier layer only on the lower layer wiring line 302 is etched back by RIE to form a barrier layer only on the side walls of the via-hole. Then, a Cu seed layer for a plated Cu deposition electrode is deposited. Consequently, a barrier/seed layer 304 is formed on the side walls of the via-hole as groundwork for plated Cu plug deposition while a seed layer 305 is formed on the lower layer wiring line 302 or bottom of the via-hole.

Then, a plated Cu film is deposited by plating process so as to fill the via-hole so that the seed layer 305 is integrated with the plated Cu film. The plated Cu film is removed by metal CMP until the barrier/seed layer 304 is exposed to leave the plated Cu film only in the via-hole, forming a plated Cu plug 306 for making an electrical connection between another lower wiring line 302 and an upper layer wiring line.

According to this embodiment, not only a barrier layer is formed only on the side walls of a via-hole but also a plated Cu plug is formed without any barrier layer between the lower layer wiring line and the plated Cu plug. Consequently, not only diffusion of copper in the plated Cu plug from the via-hole to the first interlayer dielectric film is prevented but also the resistance of the wiring is reduced because of the absence of any high resistance barrier layer between the lower wiring line and the plated Cu plug.

Then, an SiN stopper protective film 307 is deposited to prevent oxidation of the plated Cu plug 306 and form a stopper in a subsequent CMP step. Then, resist 308 is deposited to etch off by conventional RIE the SiN stopper protective film 307 and the barrier/seed layer 304 outside the plug target area.

In this way, the plated Cu plug 306 can also be formed within the via-hole according to this embodiment.

Figure 5B:
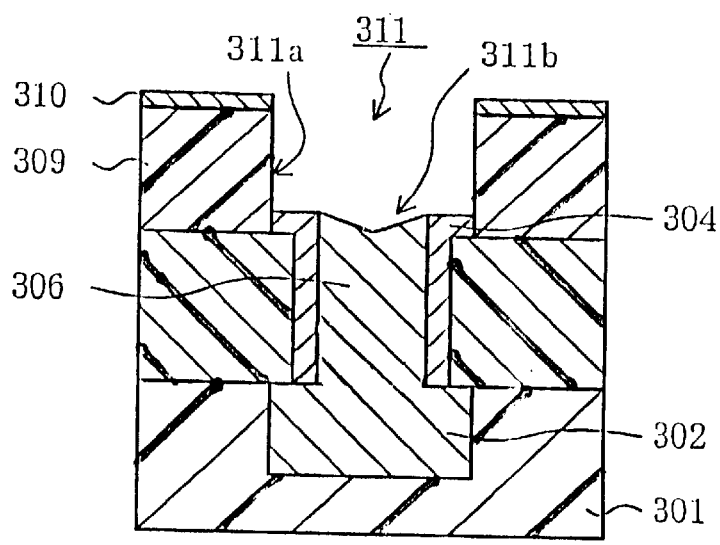

In FIG. 5(b), a second interlayer dielectric film 309 and a TiN or TaN lower layer barrier film 310 are successively deposited, and resist is applied to the entire surface to form a resist film (not shown). Then, photolithography and etching processes are applied to etch off the second interlayer film 309, SiN stopper protective film 307, and the lower barrier film 310 in the target area above the plated Cu plug until the plated Cu plug 306 is exposed, forming an upper layer wiring groove 311 on the plated Cu plug 306.

Figure 5C:
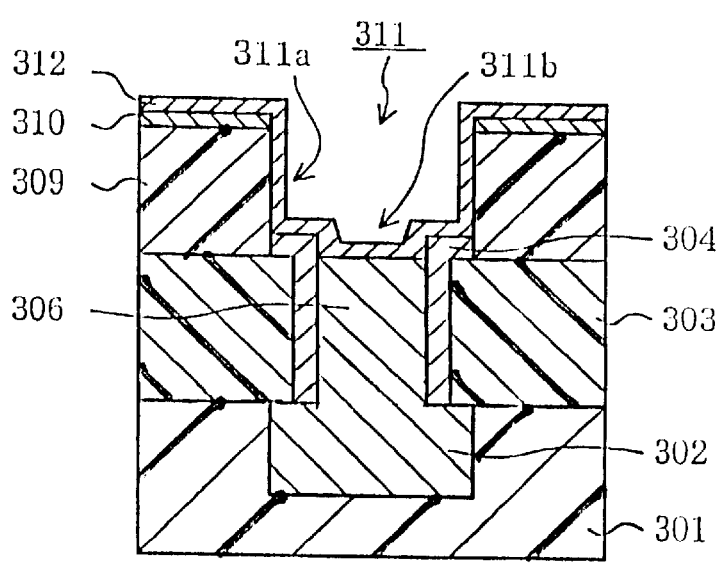

In FIG. 5(c), a TiN or TaN upper barrier film 312 is deposited on the entire surface including the upper layer wiring groove 311 to prevent copper diffusion from the upper layer wiring groove 311 into the second interlayer dielectric film 309.

Figure 6A:
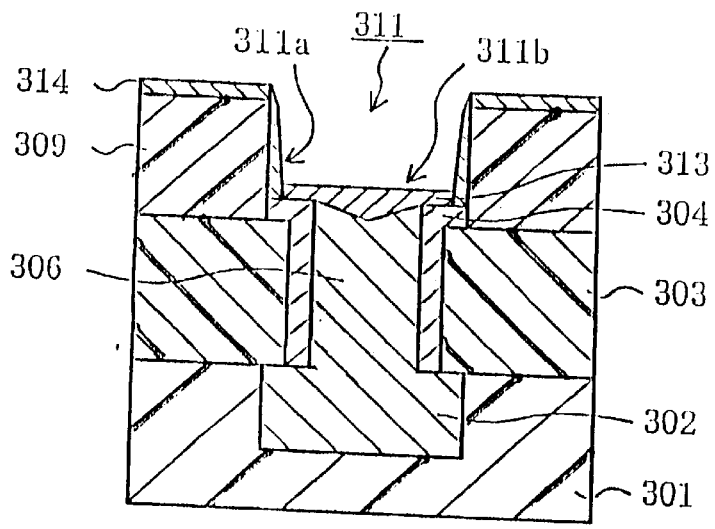
FIGS. 6(a) to (c) are sectional views of processes for making a semiconductor device according to the third embodiment of the invention, which are continued from FIG. 5.

In FIG. 6(a), the upper barrier film 312 only on the plated Cu plug 306 is etched back by RIE to leave the upper layer barrier film 312 only on the side walls 311a of the upper layer wiring groove to prevent the copper diffusion. Then, a Cu seed layer 313 is deposited thereon as a copper plating electrode. Consequently, a barrier/seed layer 314 is formed on the side walls 311a of the upper layer wiring groove as a groundwork for upper layer Cu wiring deposition, and the seed layer 313 is formed on the plated Cu plug 306 or bottom 311b of the upper layer wiring groove.

Figure 6B:
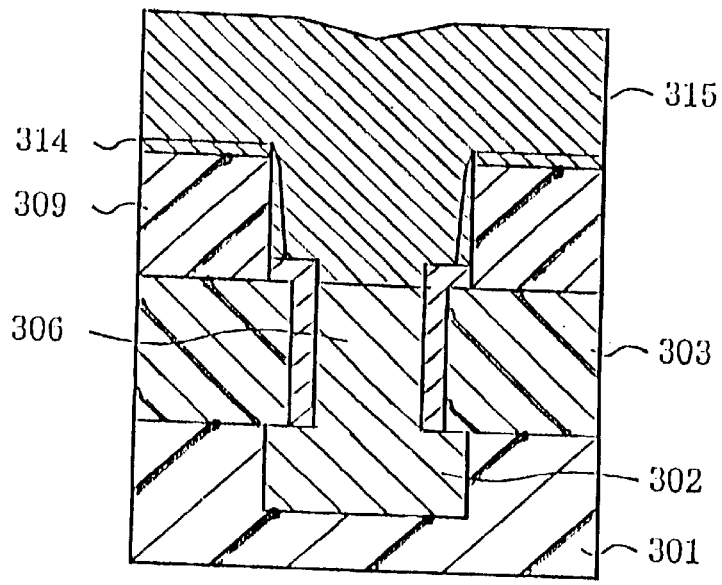

In FIG. 6(b), a plated Cu film 315 is deposited by plating process on the entire surface so as to fill the upper layer wiring groove 311, on which the barrier/seed layer 314 and the seed layer 313 are formed, so that the seed layer 313 is integrated with the plated Cu film 315.

Figure 6C:
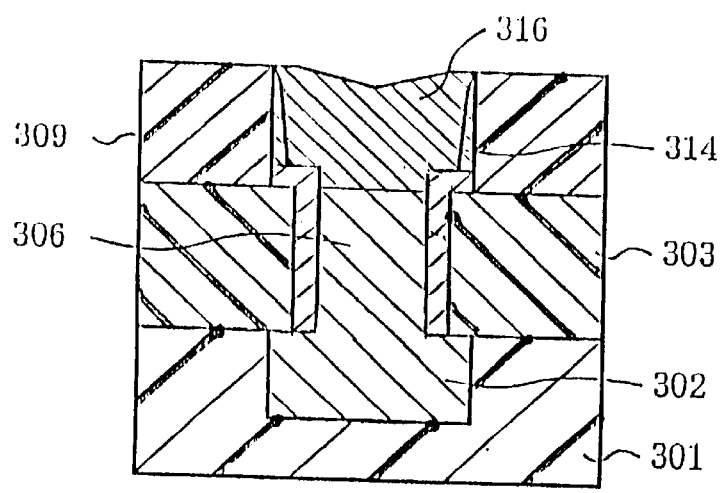

In FIG. 6(c), the plated Cu film 315 is polished by CMP process until the second interlayer dielectric film 309 is exposed to leave the plated Cu film 315 only in the upper layer wiring groove 311, forming an upper layer Cu wire 316.

As shown in FIG. 6(c), according to this embodiment it is possible to provide a low resistance conductive plug by using plated copper having good burying characteristics as a conductive plug. In addition, even with a single damascene method, a barrier layer is formed only on the side walls of a via-hole and an upper layer wiring groove to form a plated Cu plug and upper layer Cu wire without any barrier layer between the lower layer wiring and the plated Cu plug and between the plated Cu plug and the upper layer Cu wiring. Consequently, the diffusion of copper from the plated Cu plug and the upper layer wiring into the second interlayer dielectric film is prevented and, since there is no high resistance barrier layer between the lower layer wiring and the conductive plug and between the upper layer wiring and the conductive plug, the resistance of wiring is reduced, resulting in the high speed, reliable device.

(4) Fourth Embodiment

In this embodiment as shown in FIGS. 7 and 8, in order to broaden the fabrication margin, the SiN film used in the third embodiment is replaced by a TiN film which has a low resistance and a low deposition temperature.

Figure 7A:
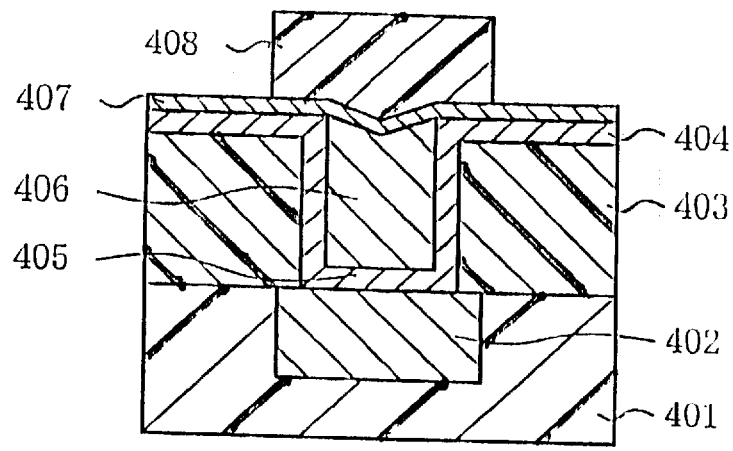
FIGS. 7(a) to (c) are sectional views of processes for making a semiconductor device according to the fourth embodiment of the invention.

In FIG. 7(a), similarly to the third embodiment, a first interlayer dielectric film 403 is deposited on the entire surface of a dielectric film 401 having a lower layer wiring line 402 formed on a semiconductor substrate (not shown) on which predetermined elements are formed. Then, resist is applied to form a resist film (not shown), and the first interlayer dielectric film 403 within a target area is subjected to photolithography and etching processes to form a desired via- or through-hole (hereinafter simply "via-hole").

Then, a barrier layer for preventing copper diffusion is deposited on the entire surface including the via-hole, and the barrier layer only on the lower layer wiring line 402 is etched back by RIE to form a barrier layer only on the side walls of the via-hole. Then, a Cu seed layer for a plated Cu deposition electrode is deposited. Consequently, a barrier/seed layer 404 is formed on the side walls of the via-hole as groundwork for plated Cu plug deposition while a seed layer 405 is formed on the lower layer wiring line 402 or bottom of the via-hole.

Then, a plated Cu film is deposited by plating process so as to fill the via-hole so that the seed layer 405 is integrated with the plated Cu film. The plated Cu film is removed by metal CMP until the barrier/seed layer 404 is exposed to leave the plated Cu film only in the via-hole, forming a plated Cu plug 406 for making an electrical connection between another lower wiring line and an upper layer wiring line.

According to this embodiment, not only a barrier layer is formed only on the side walls of a via-hole but also a plated Cu plug is formed without any barrier layer between the lower layer wiring line and the plated Cu plug. Consequently, not only diffusion of copper in the plated Cu plug from the via-hole to the first interlayer dielectric film is prevented but also the resistance of the wiring is reduced because of the absence of any high resistance barrier layer between the lower wiring line and the plated Cu plug.

Then, an TiN stopper protective film 407 is deposited to prevent oxidation of the plated Cu plug 406 and form a stopper in a subsequent CMP step. Then, resist 408 is deposited to etch off by conventional RIE the TiN stopper protective film 407 and the barrier/seed layer 404 outside the plug target area.

In this embodiment, a TiN film is used as a stopper protective film as well as a Cu barrier layer. Even if some of the TiN, which is lower in resistance than SiN, is left in the subsequent etching step to form a hole above the plug (or an upper layer wiring groove), the resistance between the wiring and the conductive plug is not increased. Also, the TiN film is lower in deposition temperature than the SiN film so that it is possible to reduce the fabrication temperature of semiconductor devices.

Figure 7B:
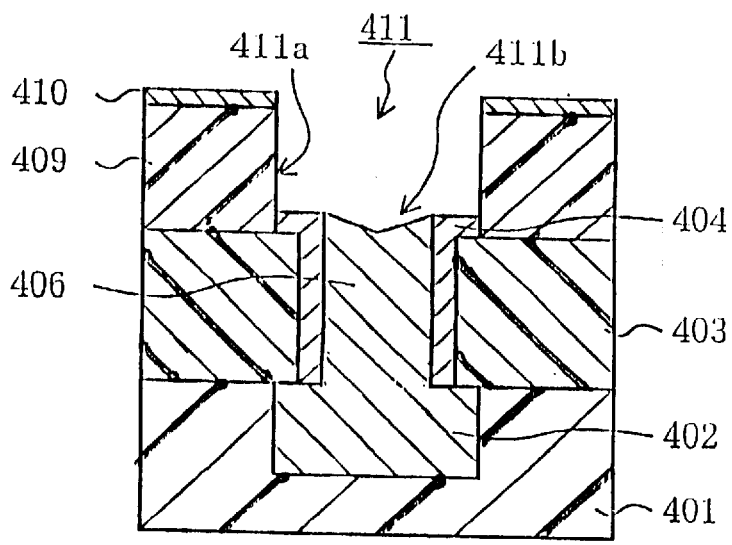

In FIG. 7(b), a second interlayer dielectric film 409 and a TiN or TaN lower layer barrier film 410 are successively deposited, and resist is applied to the entire surface to form a resist film (not shown). Then, photolithography and etching processes are applied to etch off the second interlayer film 409, TiN stopper protective film 407, and the lower barrier film 410 in the target area above the plated Cu plug until the plated Cu plug 406 is exposed, forming an upper layer wiring groove 411 on the plated Cu plug 406.

Figure 7C:
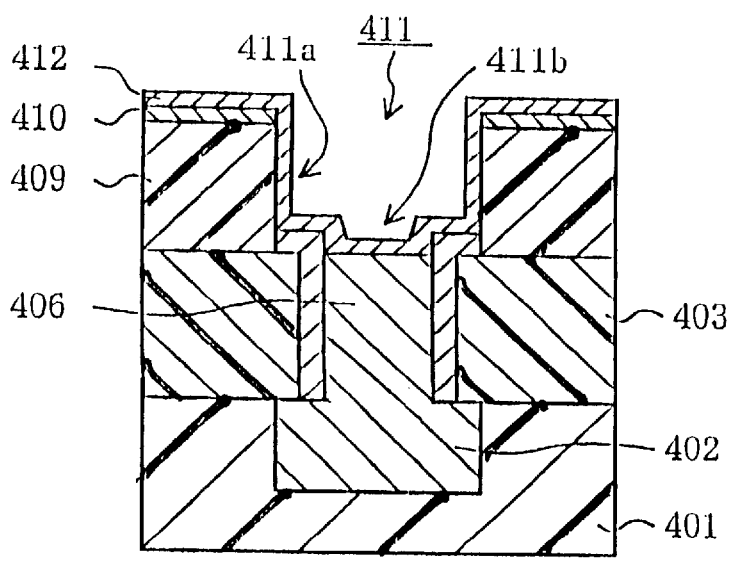

In FIG. 7(c), a TiN or TaN upper barrier film 412 is deposited on the entire surface including the upper layer wiring groove 411 to prevent copper diffusion from the upper layer wiring groove 411 into the second interlayer dielectric film 409.

Figure 8A:
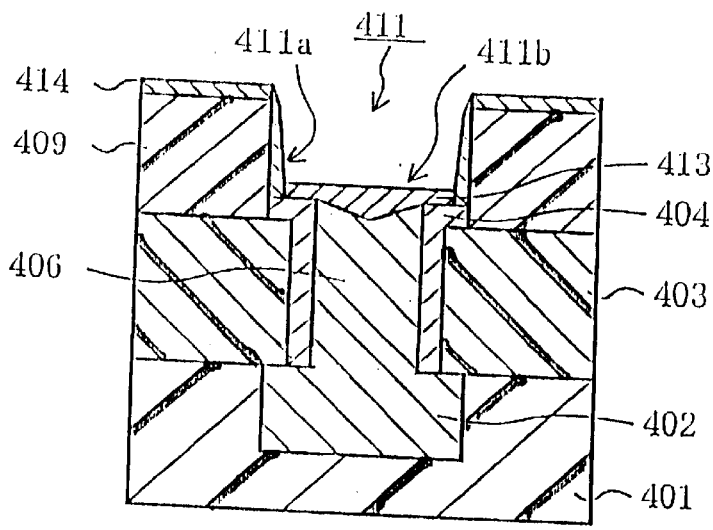
FIGS. 8(a) to (c) are sectional views of processes for making a semiconductor device according to the fourth embodiment of the invention, which are continued from FIG. 7.

In FIG. 8(a), the upper barrier film 412 only on the plated Cu plug 406 is etched back by RIE to leave the upper layer barrier film 412 only on the side walls 411a of the upper layer wiring groove to prevent the copper diffusion. Then, a Cu seed layer 413 is deposited thereon as a copper plating electrode. Consequently, a barrier/seed layer 414 is formed on the side walls 411a of the upper layer wiring groove as a groundwork for upper layer Cu wiring deposition, and the seed layer 413 is formed on the plated Cu plug 406 or bottom 411b of the upper layer wiring groove.

Figure 8B:
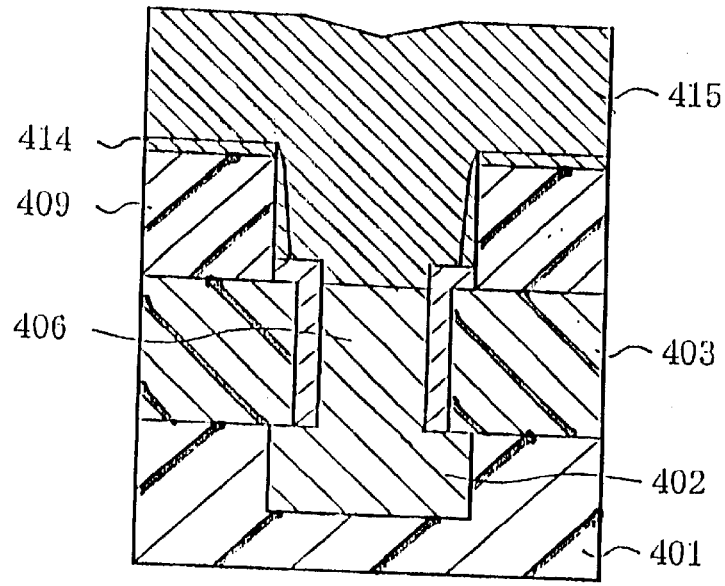

In FIG. 8(b), a plated Cu film 415 is deposited by plating process on the entire surface so as to fill the upper layer wiring groove 411, on which the barrier/seed layer 414 and the seed layer 413 are formed, so that the seed layer 413 is integrated with the plated Cu film 415.

Figure 8C:
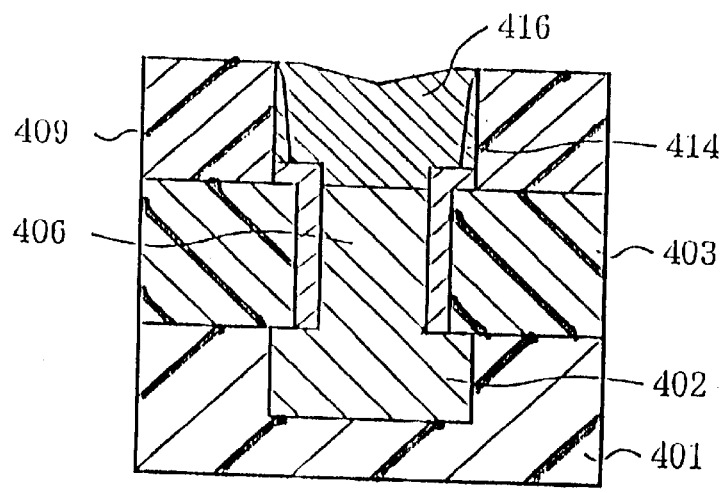

In FIG. 8(c), the plated Cu film 415 is polished by CMP process until the second interlayer dielectric film 409 is exposed to leave the plated Cu film 415 only in the upper layer wiring groove 411, forming an upper layer Cu wire 416.

As shown in FIG. 8(c), even if some of the TiN, which is lower in resistance than SiN, is left in the subsequent etching step to form a hole above the plug (or an upper layer wiring groove), the resistance between the wiring and the conductive plug is not increased. Also, the TiN film is lower in deposition temperature than the SiN film so that it is possible to reduce the fabrication temperature of semiconductor devices.

(5) Fifth Embodiment

In this embodiment as shown in FIGS. 9 and 10, in order to broaden the fabrication margin, the TiN film used in the fourth embodiment is replaced by a WN film which has a resistance lower than and a barrier property better than those of the TiN film.

Figure 9A:
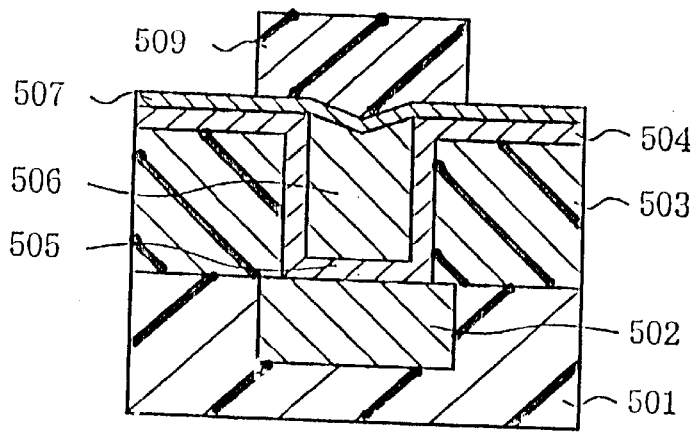
FIGS. 9(a) to (c) are sectional views of processes for making a semiconductor device according to the fifth embodiment of the invention.

In FIG. 9(a), similarly to the third and fourth embodiments, a first interlayer dielectric film 503 is deposited on the entire surface of a dielectric film 501 having a lower layer wiring line 502 formed on a semiconductor substrate (not shown) on which predetermined elements are formed. Then, resist is applied to form a resist film (not shown), and the first interlayer dielectric film 503 within a target area is subjected to photolithography and etching processes to form a desired via- or through-hole (hereinafter simply "via-hole").

Then, a barrier layer for preventing copper diffusion is deposited on the entire surface including the via-hole, and the barrier layer only on the lower layer wiring line 502 is etched back by RIE to form a barrier layer only on the side walls of the via-hole. Then, a Cu seed layer for a plated Cu deposition electrode is deposited. Consequently, a barrier/seed layer 504 is formed on the side walls of the via-hole as groundwork for lated Cu plug deposition while a seed layer 505 is formed on the lower layer wiring line 502 or bottom of the via-hole.

Then, a plated Cu film is deposited by plating process so as to fill the via-hole so that the seed layer 505 is integrated with the plated Cu film. The plated Cu film is removed by metal CMP until the barrier/seed layer 504 is exposed to leave the plated Cu film only in the via-hole, forming a plated Cu plug 506 for making an electrical connection between another lower wiring line and an upper layer wiring line.

According to this embodiment, not only a barrier layer is formed only on the side walls of a via-hole but also a plated Cu plug is formed without any barrier layer between the lower layer wiring line and the plated Cu plug. Consequently, not only diffusion of copper in the plated Cu plug from the via-hole to the first interlayer dielectric film is prevented but also the resistance of the wiring is reduced because of the absence of any high resistance barrier layer between the lower wiring line and the plated Cu plug.

Then, an WN stopper protective film 507 is deposited to prevent oxidation of the plated Cu plug 506 and form a stopper in a subsequent CMP step. Then, resist 508 is deposited to etch off by conventional RIE the WN stopper protective film 507 and the barrier/seed layer 504 outside the plug target area.

In this embodiment, a WN film is used as a stopper protective film as well as a Cu barrier layer. Even if some of the WN, which is lower in resistance than SiN and better in barrier property than TiN, is left in the subsequent etching step to form a hole above the plug (or an upper layer wiring groove), not only the resistance between the wiring and the conductive plug is not increased but also the prevention of the copper diffusion is improved. Also, the WN film is lower in deposition temperature than the SiN film so that it is possible to reduce the fabrication temperature of semiconductor devices.

Figure 9B:
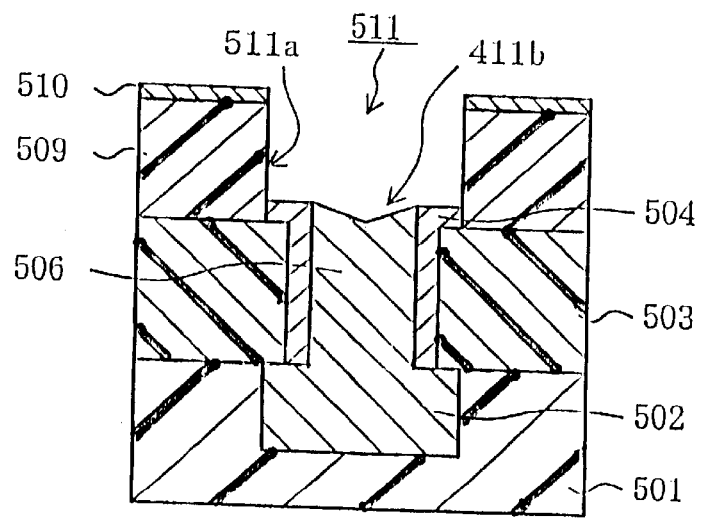

In FIG. 9(b), a second interlayer dielectric film 509 and a TiN or TaN lower layer barrier film 510 are successively deposited, and resist is applied to the entire surface to form a resist film (not shown). Then, photolithography and etching processes are applied to etch off the second interlayer film 509, the WN stopper protective film 507, and the lower barrier film 510 in the target area above the plated Cu plug until the plated Cu plug 506 is exposed, forming an upper layer wiring groove 511 on the plated Cu plug 506.

Figure 9C:
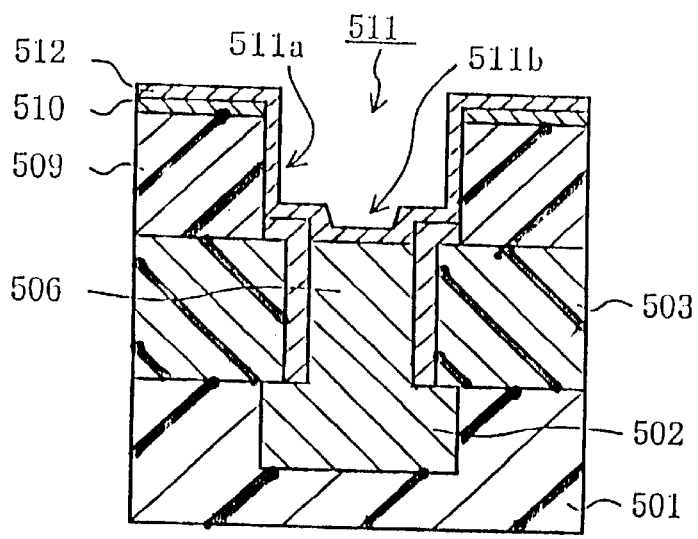

In FIG. 9(c), a TiN or TaN upper barrier film 512 is deposited on the entire surface including the upper layer wiring groove 511 to prevent copper diffusion from the upper layer wiring groove 511 into the second interlayer dielectric film 509.

Figure 10A:
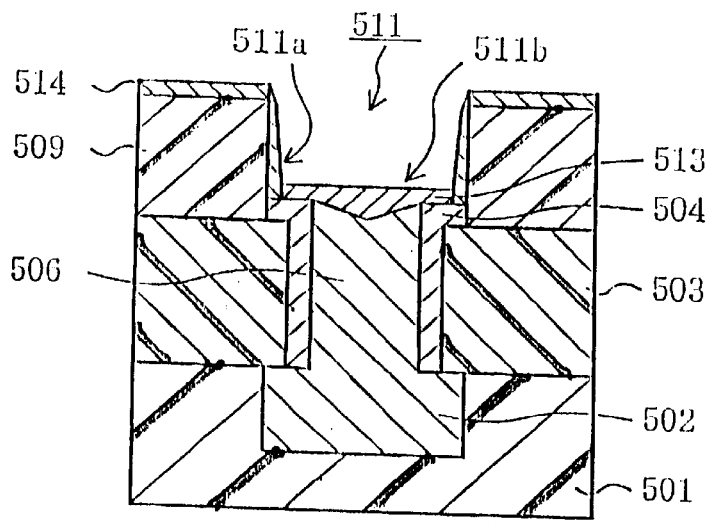
FIGS. 10(a) to (c) are sectional views of processes for making a semiconductor device according to the fifth embodiment of the invention, which are continued from FIG. 9.

In FIG. 10(a), the upper barrier film 512 only on the plated Cu plug 506 is etched back by RIE to leave the upper layer barrier film 512 only on the side walls 511a of the upper layer wiring groove to prevent the copper diffusion. Then, a Cu seed layer 513 is deposited thereon as a copper plating electrode. Consequently, a barrier/seed layer 514 is formed on the side walls 511a of the upper layer wiring groove as a groundwork for upper layer Cu wiring deposition, and the seed layer 513 is formed on the plated Cu plug 506 or bottom 511b of the upper layer wiring groove.

Figure 10B:
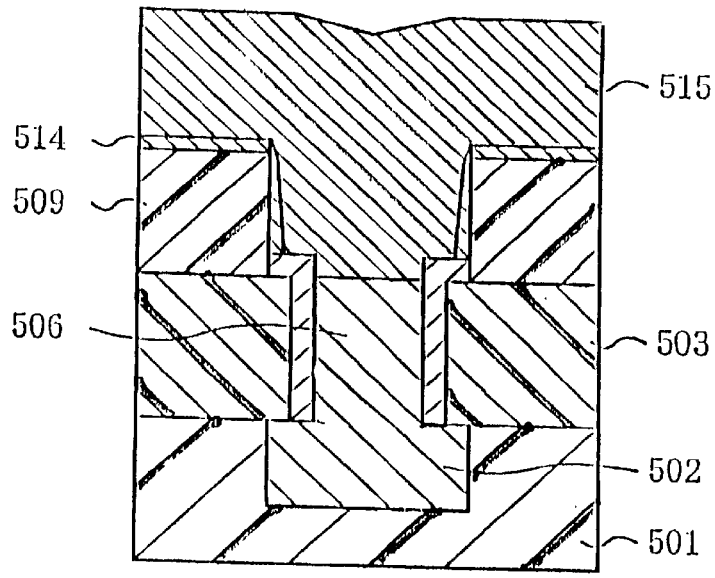

In FIG. 10(b), a plated Cu film 515 is deposited by plating process on the entire surface so as to fill the upper layer wiring groove 511, on which the barrier/seed layer 514 and the seed layer 513 are formed, so that the seed layer 513 is integrated with the plated Cu film 515.

Figure 10C:
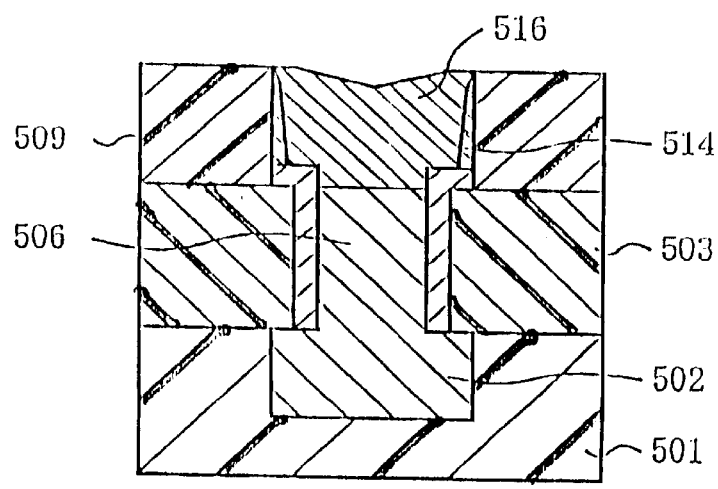

In FIG. 10(c), the plated Cu film 515 is polished by CMP process until the second interlayer dielectric film 509 is exposed to leave the plated Cu film 515 only in the upper layer wiring groove 511, forming an upper layer Cu wire 516.

As shown in FIG. 10(c), even if some of the WN, which is lower in resistance than SiN and better in barrier property than TiN, is left in the subsequent etching step to form a hole above the plug (or an upper layer wiring groove), the resistance between the wiring and the conductive plug is not increased, and the prevention of the copper diffusion is ensured. Also, the WN film is lower in deposition temperature than the SiN film so that it is possible to reduce the fabrication temperature of semiconductor devices.

(6) Sixth Embodiment

In this embodiment as shown in FIGS. 11 and 12, in order to broaden the fabrication margin, the WN film used in the fifth embodiment is replaced by a TaN film which is superior to TiN and WN films with respect to thin film and barrier properties.

Figure 11A:
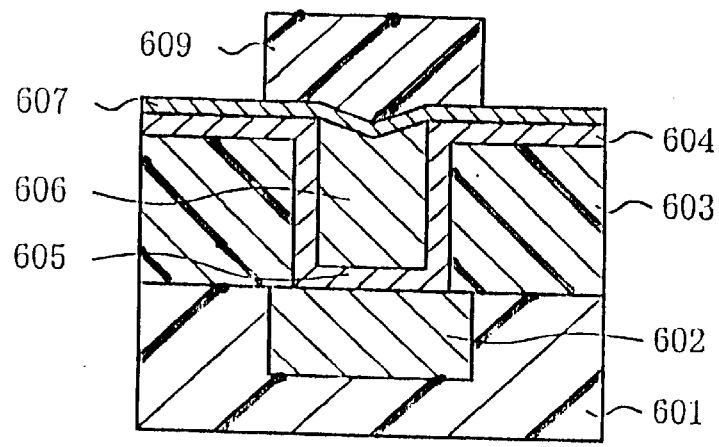
FIGS. 11(a) to (c) are sectional views of processes for making a semiconductor device according to the sixth embodiment of the invention.

In FIG. 11(a), similarly to the above embodiments, a first interlayer dielectric film 603 is deposited on the entire surface of a dielectric film 601 having a lower layer wiring line 602 formed on a semiconductor substrate (not shown) on which predetermined elements are formed. Then, resist is applied to form a resist film (not shown), and the first interlayer dielectric film 603 within a target area is subjected to photolithography and etching processes to form a desired via- or through-hole (hereinafter simply "via-hole").

Then, a barrier layer for preventing copper diffusion is deposited on the entire surface including the via-hole, and the barrier layer only on the lower layer wiring line 602 is etched back by RIE to form a barrier 10 layer only on the side walls of the via-hole. Then, a Cu seed layer for a plated Cu deposition electrode is deposited. Consequently, a barrier/seed layer 604 is formed on the side walls of the via-hole as groundwork for plated Cu plug deposition while a seed layer 605 is formed on the lower layer wiring line 602 or bottom of the via-hole.

Then, a plated Cu film is deposited by plating process so as to fill the via-hole so that the seed layer 605 is integrated with the plated Cu film. The plated Cu film is removed by metal CMP until the barrier/seed layer 604 is exposed to leave the plated Cu film only in the via-hole, forming a plated Cu plug 606 for making an electrical connection between another lower wiring line and an upper layer wiring line.

According to this embodiment, not only a barrier layer is formed only on the side walls of a via-hole but also a plated Cu plug is formed without any barrier layer between the lower layer wiring line and the plated Cu plug. Consequently, not only the diffusion of copper in the plated Cu plug from the via-hole to the first interlayer dielectric film is prevented but also the resistance of the wiring is reduced because of the absence of any high resistance barrier layer between the lower wiring line and the plated Cu plug.

Then, an TaN stopper protective film 607 is deposited to prevent oxidation of the plated Cu plug 606 and form a stopper in a subsequent CMP step. Then, resist 608 is deposited to etch off by conventional RIE the TaN stopper protective film 607 and the barrier/seed layer 604 outside the plug target area.

In this embodiment, a TaN film is used as a stopper protective film because it has an excellent thin film property of the barrier layer and an excellent stopper property. Since the TaN film, which is superior to the TiN and WN films with respect to thin film and barrier properties, is used as a stopper protective film, it is possible to provide thinner film barrier layers and higher barrier effects than before, which makes possible to not only avoid the influence of barrier layer thickness upon wiring characteristics in submicron technology but also maintain the low copper wiring resistance. In addition, since the TaN film has lower resistivity than silicate films, the reliability of the process and device is increased.

Figure 11B:
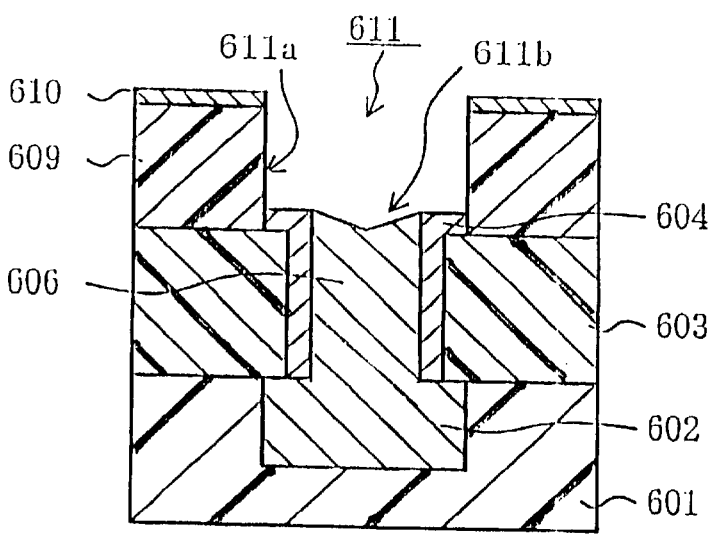

In FIG. 11(b), a second interlayer dielectric film 609 and a TiN or TaN lower layer barrier film 610 are successively deposited, and resist is applied to the entire surface to form a resist film (not shown). Then, photolithography and etching processes are applied to etch off the second interlayer film 609, the TaN stopper protective film 607, and the lower barrier film 610 in the target area above the plated Cu plug until the plated Cu plug 606 is exposed, forming an upper layer wiring groove 611 on the plated Cu plug 606.

Figure 11C:
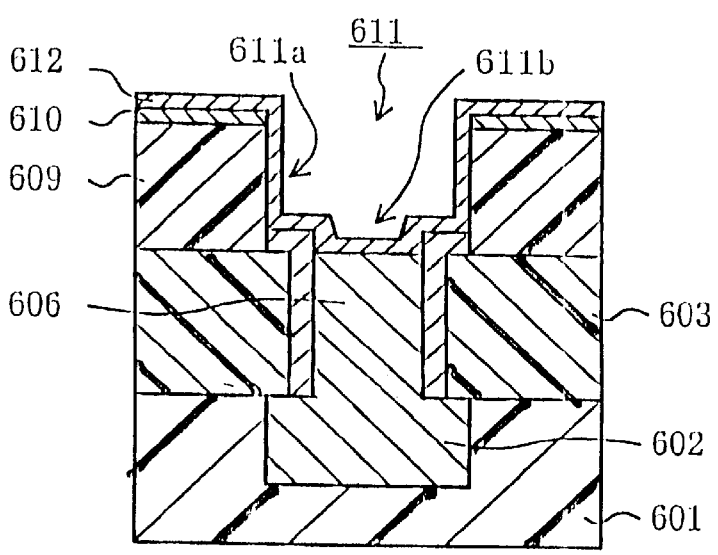

In FIG. 11(c), a TiN or TaN upper barrier film 612 is deposited on the entire surface including the upper layer wiring groove 611 to prevent copper diffusion from the upper layer wiring groove 611 into the second interlayer dielectric film 609.

Figure 12A:
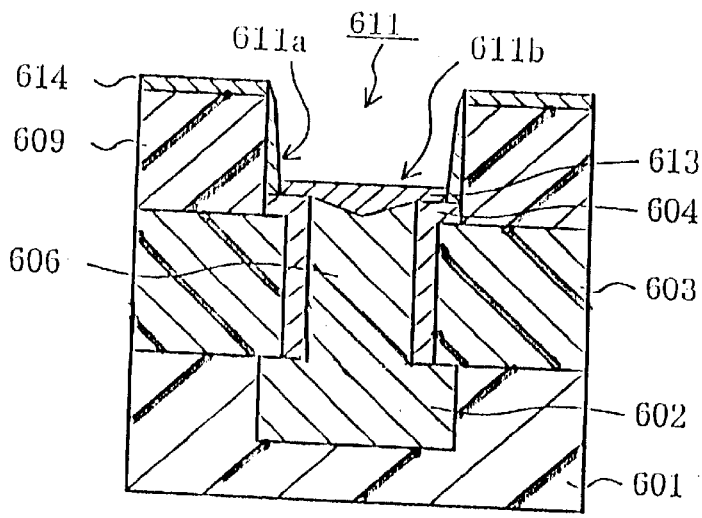
FIGS. 12(a) to (c) are sectional views of processes for making a semiconductor device according to the sixth embodiment of the invention, which are continued from FIG. 11.

In FIG. 12(a), the upper barrier film 612 only on the plated Cu plug 606 is etched back by RIE to leave the upper layer barrier film 612 only on the side walls 611a of the upper layer wiring groove to prevent the copper diffusion. Then, a Cu seed layer 613 is deposited thereon as a copper plating electrode. Consequently, a barrier/seed layer 614 is formed on the side walls 611a of the upper layer wiring groove as a groundwork for upper layer Cu wiring deposition, and the seed layer 613 is formed on the plated Cu plug 606 or bottom 611b of the upper layer wiring groove.

Figure 12B:
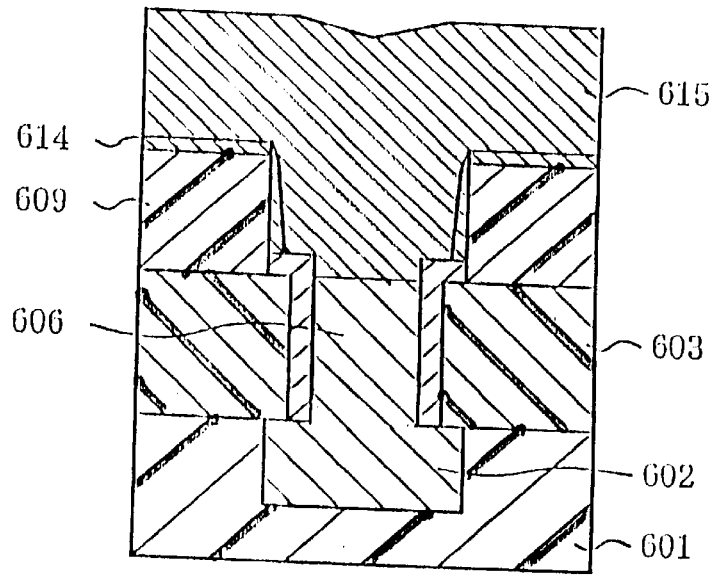

In FIG. 12(b), a plated Cu film 615 is deposited by plating process on the entire surface so as to fill the upper layer wiring groove 611, on which the barrier/seed layer 614 and the seed layer 613 are formed, so that the seed layer 613 is integrated with the plated Cu film 615.

Figure 12C:
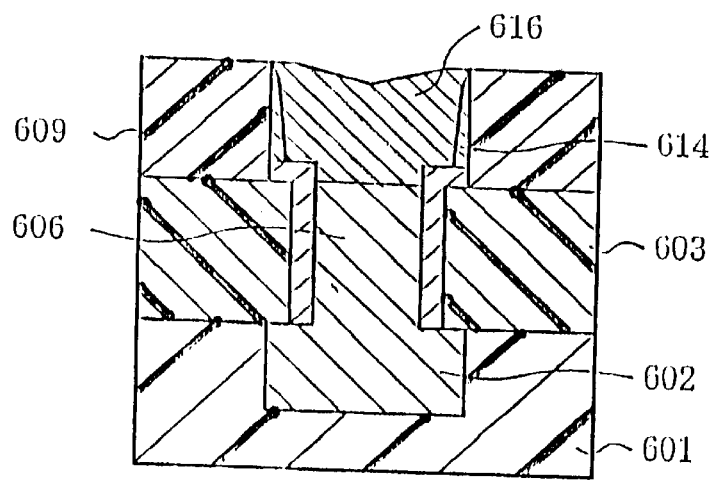
Figure 13A:
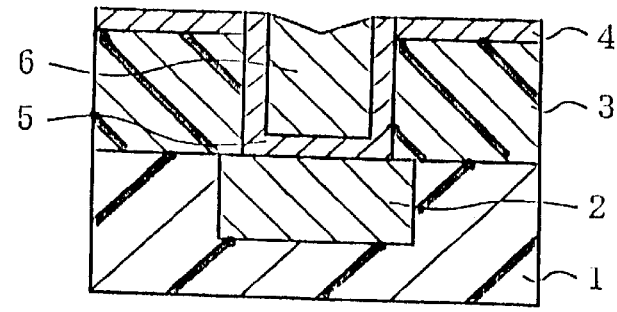
FIGS. 13(a) to (c) are sectional views of processes for making a semiconductor device according to a conventional method.
Figure 13B:
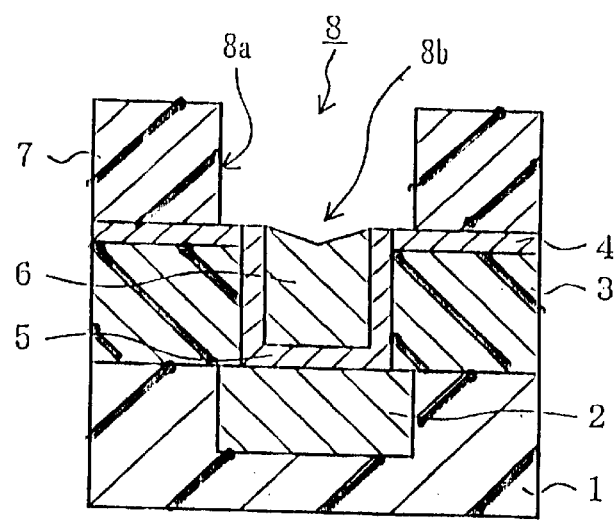
Figure 13C:
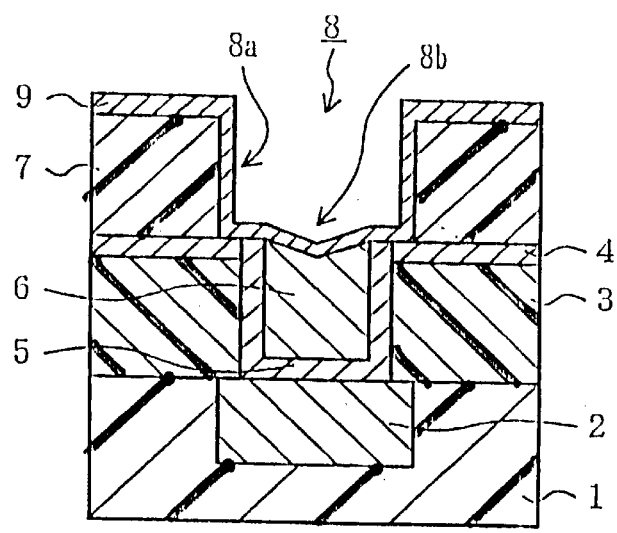
Figure 14A:
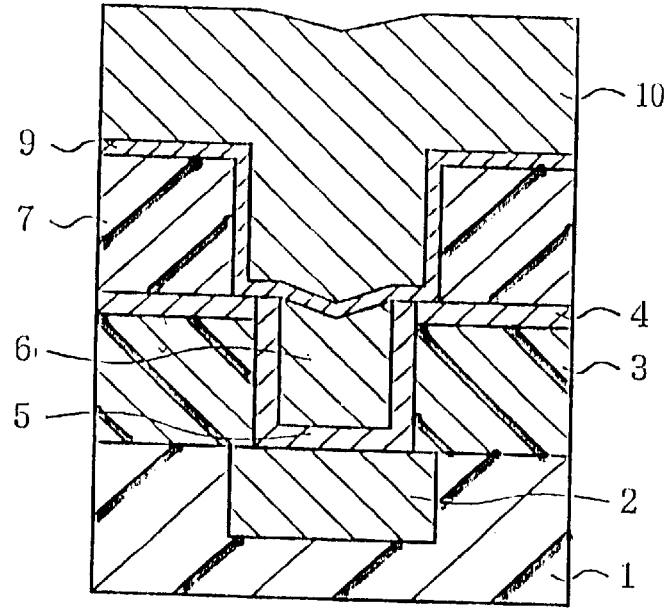
FIGS. 14(a) to (b) are sectional views of processes for making a semiconductor device according to a conventional method, which are continued from FIG. 13.
Figure 14B:
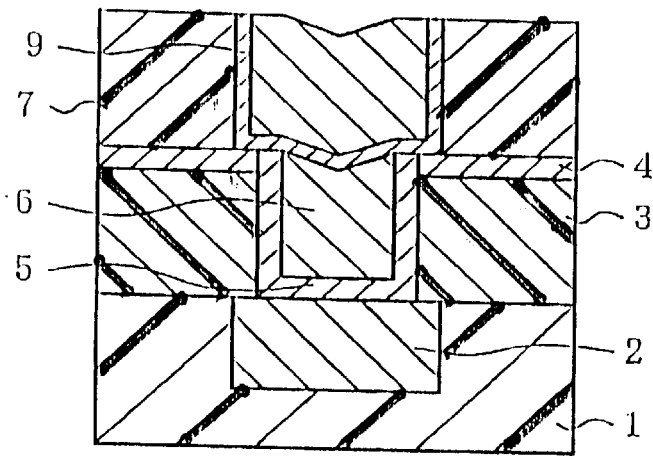

In FIG. 12(c), the plated Cu film 615 is polished by CMP process until the second interlayer dielectric film 608 is exposed to leave the plated Cu film 615 only in the upper layer wiring groove 611, forming an upper layer Cu wire 616.

As shown in FIG. 12(c), since the TaN film, which is superior to the TiN and WN films with respect to thin film and barrier properties, it is possible to provide thinner film barrier layer and higher barrier effects than before, which makes possible to avoid the influence of the barrier layer thickness upon the wiring characteristics and maintain the low resistance of the copper wiring. In addition, the TaN film is lower in resistance than the silicon containing films, the reliability of the process and device is improved.

As described above, according to the first to sixth embodiments, an upper layer Cu wire can be formed by the single damascene process without forming a high resistance barrier layer between the upper layer wiring line and the conductive plug to prevent the copper diffusion. Consequently, a high aspect ratio wiring below quarter-micron wiring can be formed without using the dual damascene process. Thus, it is possible to not only maintain the low wiring resistance by using a low resistance wiring material, such as copper, but also provide a high performance, reliable device.

Although the preferred embodiments of the invention have been described above, the invention is not limited to such structures. A variety of modifications and changes may be made by a person having an ordinary skill in the art within the sprit and scope of the subject matter described in the following claims and, therefore, it is understood that those modifications and changes fall within the protective scope of the invention.

For example, the semiconductor devices using the plated Cu wiring and processes for making the same have been described above, but the invention is applicable to semiconductor devices using CVD Cu wiring in place of the plated Cu wiring and methods of making the same.

The invention is also applicable to semiconductor devices and processes for making the same, wherein the Cu wiring material in the above embodiments is replaced by another wiring material such as aluminum (Al).

Further, it is applicable to semiconductor devices and processes for making the same, wherein the W or plated Cu plug is replaced by another conductive plug such as a polysilicon conductive plug.

Moreover, it is applicable to semiconductor devices of the multiple layer structure in stead of the double layer structure as described above and processes for making the same.

According to the invention, by the conventional damascene process it is possible to form an upper wiring without any barrier layer between the upper layer wiring and the conductive plug by forming a barrier layer only on the side walls of an upper layer wiring groove. Consequently, it is possible to not only prevent the upper layer wiring material from diffusing from the upper layer wiring groove into the second interlayer dielectric film but also minimize the wiring resistance due to the absence of any high resistance barrier layer between the upper layer wiring and the conductive plug, resulting in the high speed and reliable device.

By using the copper plug which has excellent burying characteristics, it is possible to not only minimize the resistance of the conductive plug but also form a barrier layer only on the side walls of via-holes by the single damascene process, forming a plated Cu plug without any barrier layer between the lower layer wiring and the plated Cu plug.

By using a stopper protective film of SiN or the like, it is possible to prevent oxidation of the plated Cu plug as well as a CMP stopper. It is preferred to use the TiN film because even if some of the TiN is left in the subsequently step of opening holes by etching (or forming an upper layer wiring groove), there is no rise in resistance between the wiring and the conductive plug due to the lower resistance of the TiN film than that of the SiN film. In addition, the deposition temperature of the TiN film is lower than that of the SiN film, the fabrication temperature of semiconductor devices is reduced.

Where the WN film, which is lower in resistance than the SiN film and superior to the TiN film with respect to the barrier property, is used as a stopper protective film, even if some of the WN is left in the subsequent step of opening holes above the plug by etching (or forming an upper layer wiring groove), not only there is no rise in the resistance between the wiring and the conductive plug but also prevention of the copper diffusion is ensured. In addition, since the deposition temperature of a WN film is lower than that of the SiN film, the fabrication temperature of semiconductor devices can be reduced.

Where the TaN film, which is superior to the TiN and WN films with respect to the thin film property and barrier effects, is used as a stopper film, it is possible to not only reduce the film thickness of barrier layers but also improve the barrier effects, which makes it possible to not only avoid the influence of a barrier layer thickness upon the wiring characteristics but also maintain the low resistance of copper wiring. Also, the resistance of a TaN film is lower than that of the SiN film so that the reliability of the process and the device is increased.

As has been described above, according to the first to sixth embodiments, an upper layer Cu wire is formed by the single damascene process without forming any high resistance barrier layer between the upper layer wiring and the conductive plug. Thus, a high aspect ratio wiring below quarter-micron wiring can be formed without using the dual damascene process. Consequently, it is possible to not only maintain the low resistance of wiring by using a low resistance wiring material, such as copper, but also provide a high performance reliable device.

What is claimed is:

1. A process for making a semiconductor device, comprising the steps of:
    a first step of embedding a conductive material in a via-hole formed in a first interlayer dielectric film to form a conductive plug connected to a lower layer wiring line;
    a second step of forming an upper layer wiring groove in a second interlayer dielectric film formed on said conductive plug such that a target area of said conductive plug is exposed in said upper layer wiring groove;
    a third step of forming a first barrier layer on an entire surface of said second interlayer dielectric film including said upper layer wiring groove;
    a fourth step of selectively removing said first barrier layer formed on said conductive plug;
    a fifth step of embedding a material to form a seed layer on a surface of said conductive plug expose in said upper layer wiring groove; and
    a sixth step of embedding a wiring material in said upper layer wiring groove to form an upper layer wiring line, said wiring material being same as said material for said seed layer in said fifth step.

2. A process for making a semiconductor device according to claim 1, wherein said electrode material for said seed layer and said wiring material for said upper layer wiring line are copper.

3. A process for making a semiconductor device according to claim 1, which further comprises:
    a seventh step of forming a second barrier layer on an entire surface of said first interlayer dielectric film including said via-hole prior to said first step;
    an eighth step of forming a resist film on said conductive plug and a peripheral area of said conductive plug after said first step but prior to said second step; and
    a ninth step of selectively removing said second barrier layer by etching such that said second barrier layer is left only in said via-hole and said peripheral area of said conductive plug prior to said second step but subsequent to said eighth step.

4. A process for making a semiconductor device according to claim 1, which further comprises:
    a tenth step of forming a stopper protective film on an entire surface of said second interlayer dielectric film including said conductive plug prior to said second step; and
    an eleventh step of selectively removing said stopper protective film outside said target area of said conductive plug prior to said second step but subsequent to said tenth step.

5. A process for making a semiconductor device according to claim 4, wherein said stopper protective film is made of silicon nitride (SiN).

6. A process for making a semiconductor device according to claim 4, wherein said stopper protective film is made of titanium nitride (TiN).

7. A process for making a semiconductor device according to claim 4, wherein said stopper protective film is made of tungsten nitride (WN).

8. A process for making a semiconductor device according to claim 4, wherein said stopper protective film is made of tantalum nitride (TaN).

9. A process for making a semiconductor device according to claim 3, which further comprises:
    a twelfth step of forming a stopper protective film on an entire surface of said second interlayer dielectric film including said conductive plug prior to said eighth stop; and a thirteenth step of selectively removing said stopper protective film outside said target area of said conductive plug prior to said eighth step but subsequent to said twelfth step.

10. A process for making a semiconductor device according to claim 9, wherein said stopper protective film is made of silicon nitride (SiN).

11. A process for making a semiconductor device according to claim 9, wherein said stopper protective film is made of titanium nitride (TiN).

12. A process for making a semiconductor device according to claim 9, wherein said stopper protective film is made of tungsten nitride (WN).

13. A process for making a semiconductor device according to claim 9, wherein said stopper protective film is made of tantalum nitride (TaN).

14. A process for making a semiconductor device, comprising the steps of:

a first step of embedding a conductive material in a via-hole formed in a first interlayer dielectric film to form a conductive plug connected to a lower layer wiring line;

a second step of forming an upper layer wiring groove in a second interlayer dielectric film formed on said conductive plug such that a target area of said conductive plug is exposed in said upper layer wiring groove;

a third step of forming a first barrier layer on an entire surface of said second interlayer dielectric film including said upper layer wiring groove;

a fourth step of selectively removing said first barrier layer formed on said conductive plug;

a fifth step of embedding a wiring material in said upper layer wiring groove by plating process to form an upper layer wiring line, wherein the improvement comprise;

a sixth step of forming a second barrier layer on an entire surface of said first interlayer dielectric film including said via-hole prior to said first step;

a seventh step of forming a resist film on said conductive plug and a peripheral area of said conductive plug after said first step but prior to said second step; and an eighth step of selectively removing said second barrier layer by etching such that said second barrier layer is left only in said via-hole and said peripheral area of said conductive plug prior to said second step but subsequent to said seventh step.

* * * * *